United States Patent

Saito et al.

[11] Patent Number: 5,993,597
[45] Date of Patent: Nov. 30, 1999

[54] PLASMA ETCHING ELECTRODE

[75] Inventors: Kazuo Saito; Yasushi Mochizuki; Akira Yamaguchi, all of Tokyo, Japan

[73] Assignee: Nisshinbo Industries, Inc., Tokyo, Japan

[21] Appl. No.: 08/883,310

[22] Filed: Jun. 26, 1997

[30] Foreign Application Priority Data

Jun. 28, 1996 [JP] Japan ..................... 8-188336

[51] Int. Cl.⁶ .............................. C23F 1/02; C23C 16/00
[52] U.S. Cl. ........................................ 156/345; 118/723 E
[58] Field of Search ........................... 118/723 R, 723 E, 118/723 ER; 156/345; 315/111.21

[56] References Cited

U.S. PATENT DOCUMENTS

| | | | |
|---|---|---|---|
| 5,074,456 | 12/1991 | Degner et al. | 228/121 |
| 5,569,356 | 10/1996 | Lenz et al. | 156/643.1 |
| 5,888,414 | 3/1999 | Collins et al. | 216/68 |

FOREIGN PATENT DOCUMENTS 9-129605  1/1998  Japan .

*Primary Examiner*—Bruce Breneman
*Assistant Examiner*—Luz Alejandro
*Attorney, Agent, or Firm*—Kubovcik & Kubovcik

[57] ABSTRACT

The present invention provides:

a plasma etching electrode made of single-crystal silicon, which has an electric resistance of 0.0001–40 Ωcm, whose crystal faces are (100), which is doped with boron or phosphorus, whose surface has been subjected to an etching treatment with an acid, and which has been subjected to a heat treatment in vacuum, or a plasma etching electrode made of polycrystalline silicon, which has an electric resistance of 0.0001–40 Ωcm, which is doped with boron or phosphorus, whose surface has been subjected to an etching treatment with an acid, and which has been subjected to a heat treatment in vacuum, and a process for producing a plasma etching electrode, which comprises doping metallic silicon with boron or phosphorus, subjecting the surface of the resulting material to an etching treatment with an acid, and subjecting the surface-etched material to a heat treatment in vacuum.

With the plasma etching electrode, dust generation is minimized and uniform etching can be realized.

4 Claims, No Drawings

PLASMA ETCHING ELECTRODE

BACKGROUND OF THE INVENTION

1. Field of the Invention

The present invention relates to a parallel-plate type plasma etching electrode used in production of semiconductor integrated circuits (e.g. IC and LSIC) or guidewaves for optical communication, as well as to a process for production of the plasma etching electrode.

2. Description of the Related Art

As semiconductor integrated circuits are becoming increasingly finer and more dense, the technical requirements for a parallel-plate type plasma etching electrode capable of forming a fine pattern on a wafer at a high accuracy are becoming higher.

The plasma etching electrodes in current use are made of aluminum, graphite, glassy carbon, quartz, metallic silicon or the like.

These conventional plasma etching electrodes, however, wear during plasma etching and, moreover, react with an introduced gas to become an oxide or a fluoride and vaporize. This vaporization may badly affect a material to be etched (e.g. a semiconductor device) although the degree differs depending upon the material constituting the electrode or the purity of the material.

For example, aluminum, when it wears, generates its oxide which becomes a metal contamination source for material to be etched. Graphite, which is used as a sintered material, generates a large amount of dust during etching. Glassy carbon, although low in dust generation, has a limitation in purity and, further, contains a metal oxide which becomes a metal contamination source for material to be etched. Quartz, which originally has an insulating property, is not suitable for use as an electrode.

Meanwhile, metallic silicon, which is a material used for production of semiconductor, has an advantage that its impurities can be controlled to the same level as in semiconductor device, etc.

The conventional plasma etching electrode made of metallic silicon, however, generates dust because the microcracks presumed to be present on the electrode surface are destroyed by a plasma. Although the influence of this dust on material to be etched (semiconductor device, etc.) is thought to be small as compared with the cases using electrodes of other materials such as mentioned above, because the metallic silicon constituting the dust is the same material as used in the semiconductor device, etc., it is inevitable to avoid the contamination of the material to be etched, with the dopant contained in the dust.

Therefore, if there is developed a plasma etching electrode made of metallic silicon wherein the impurities are controlled to the same level as in semiconductor device, etc. and which generates no dust during plasma etching, it will greatly contribute to the development of a finer and more dense semiconductor integrated circuit.

OBJECT AND SUMMARY OF THE INVENTION

In view of the above-mentioned situation of the prior art, the present invention is intended to provide a plasma etching electrode wherein dust generation is minimized and which enables uniform etching, and a process for production of the plasma etching electrode.

According to the present invention, there is provided:

a plasma etching electrode made of single-crystal silicon, which has an electric resistance of 0.0001–40 Ωcm, whose crystal faces are (100), which is doped with boron or phosphorus, whose surface has been subjected to an etching treatment with an acid, and which has been subjected to a heat treatment in vacuum, or a plasma etching electrode made of polycrystalline silicon, which has an electric resistance of 0.0001–40 Ωcm, which is doped with boron or phosphorus, whose surface has been subjected to an etching treatment with an acid, and which has been subjected to a heat treatment in vacuum, and a process for producing a plasma etching electrode, which comprises doping metallic silicon with boron or phosphorus, subjecting the surface of the resulting material to an etching treatment with an acid, and subjecting the surface-etched material to a heat treatment in vacuum.

DETAILED DESCRIPTION OF THE INVENTION

The plasma etching electrode of the present invention is made of single-crystal silicon or polycrystalline silicon as mentioned above. This metallic silicon preferably has an electric resistance of 0.0001–40 Ωcm. When the electric resistance is larger than the above upper limit, the voltage required for generation of plasma is extremely high, heavily damaging the electrode. When the electric resistance is smaller than the above lower limit, a large amount of a dopant is contained in the metallic silicon, inviting the contamination of a material to be etched.

When the metallic silicon is single-crystal silicon, three crystal faces (100), (110) and (111) are possible; however, in the present plasma etching electrode, the crystal faces of the metallic silicon are most preferably (100). When faces (110) and (111) are used, cracking appears easily in boring or peripheral machining and this invites generation of a large amount of dust during etching.

While various dopants are used in conventional plasma etching electrodes, boron or phosphorus is used as a dopant in the plasma etching electrode of the present invention. When a dopant other than boron or phosphorus is used, dust is generated and easily contaminates a material to be etched (e.g. silicon wafer) and, although the reason is unknown, the amount of dust generated is large.

The amount of boron used as a dopant can be, for example, $1 \times 10^{-4}$ to $1 \times 10^{-3}$ ppm, and the amount of phosphorus used as a dopant can be, for example, $3 \times 10^{-4}$ ppm to 10%. When the dopant amount is within the above range, the plasma etching electrode of the present invention can have an electric resistance falling in the above range.

The plasma etching electrode of the present invention is made from a silicon material satisfying the above requirements. However, even when the silicon material is processed under sufficient conditions, the resulting electrode has slight strain and microcracks on the surface; when such an electrode is used for plasma etching as it is, silicon is peeled from the strain and microcracks, generating a large amount of dust. Therefore, in the plasma etching electrode of the present invention, chemical etching with an acid is conducted against the electrode surface to reduce the strain and microcracks and thereby achieve significant reduction in dust generation.

The acid used in the chemical etching can be any acid as long as it can dissolve metallic silicon. The acid includes, for example, hydrofluoric acid, a mixed acid of hydrofluoric acid, nitric acid, acetic acid, etc.

After the chemical etching, a heat treatment in vacuum is conducted as a final step, whereby a plasma etching electrode of the present invention can be obtained. The heat treatment in vacuum has two purposes. The first purpose is to further reduce the microcracks remaining in a small amount after the chemical etching with an acid. The second purpose is to decompose the acid remaining in a small amount on the electrode surface after the chemical etching and remove other impurities.

3

The temperature employed in the heat treatment in vacuum can be, for example, 200° C. to 1,200° C., preferably 400° C. to 1,100° C.

With the thus-produced plasma etching electrode of the present invention, dust generation caused by detachment of silicon is minimized and no contamination source is produced. Therefore, the present electrode can provide high-accuracy plasma etching.

The present invention is hereinafter described in more detail by way of Examples.

EXAMPLE 1

To a single-crystal silicon sheet which was doped with boron, which had an electric resistance of 35 Ωcm and which had crystal faces of (100), were applied boring (788 holes of 0.5 mm in diameter at a hole-to-hole distance of 7 mm) and machining into a disc shape (outer diameter: 280 mm, thickness: 5 mm), using a diamond tool. This disc-shaped silicon sheet was immersed in hydrofluoric acid of 50° C. for 60 seconds to conduct chemical etching. Then, in order to remove the impurities on the silicon sheet, the silicon sheet was placed in a vacuum furnace and subjected to a heat treatment at 400° C. for 1 hour, whereby a plasma etching electrode was produced.

EXAMPLE 2

A plasma etching electrode was produced in the same manner as in Example 1 except that there was used a single-crystal silicon sheet which was doped with boron, which had an electric resistance of 15 Ωcm and which had crystal faces of (100) and that the silicon sheet was immersed in a mixed acid (hydrofluoric acid:nitric acid:acetic acid=1:4:1 [parts by weight]) of 50° C. for 60 seconds.

EXAMPLES 3–11

Plasma etching electrodes were produced in the same manner as in Example 2 except that single-crystal silicon sheets shown in Table 1 were used.

4

EXAMPLE 12

A plasma etching electrode was produced in the same manner as in Example 1 except that a polycrystalline silicon sheet doped with boron and having an electric resistance of 35 Ωcm was used.

EXAMPLE 13

A plasma etching electrode was produced in the same manner as in Example 2 except that a single-crystal silicon sheet doped with boron and having an electric resistance of 15 Ωcm was used.

EXAMPLES 14–22

Plasma etching electrodes were produced in the same manner as in Example 2 except that polycrystalline silicon sheets shown in Table 1 were used.

TABLE 1

|  |  | Silicon sheet | | | Treatment for cracks | |
|---|---|---|---|---|---|---|
|  |  | Electric resistance (λcm) | Single crystal or polycrystal /crystal face | Dopant | Chemical etching | In-vacuum heat (400° C.) treatment |
| Examples | 1 | 35 | Single crystal /(100) | Boron | Hydrofluoric acid | Yes |
|  | 2 | 15 | Ditto | Boron | Mixed acid | Yes |
|  | 3 | 15 | Ditto | Phosphorus | Ditto | Yes |
|  | 4 | 2 | Ditto | Boron | Ditto | Yes |
|  | 5 | 2 | Ditto | Phosphorus | Ditto | Yes |
|  | 6 | 0.1 | Ditto | Boron | Ditto | Yes |
|  | 7 | 0.1 | Ditto | Phosphorus | Ditto | Yes |
|  | 8 | 0.01 | Ditto | Boron | Ditto | Yes |
|  | 9 | 0.01 | Ditto | Phosphorus | Ditto | Yes |
|  | 10 | 0.003 | Ditto | Boron | Ditto | Yes |
|  | 11 | 0.003 | Ditto | Phosphorus | Ditto | Yes |
|  | 12 | 35 | Polycrystal | Boron | Hydrofluoric acid | Yes |
|  | 13 | 15 | Ditto | Boron | Mixed acid | Yes |
|  | 14 | 15 | Ditto | Phosphorus | Ditto | Yes |
|  | 15 | 2 | Ditto | Boron | Ditto | Yes |
|  | 16 | 2 | Ditto | Phosphorus | Ditto | Yes |
|  | 17 | 0.1 | Ditto | Boron | Ditto | Yes |
|  | 18 | 0.1 | Ditto | Phosphorus | Ditto | Yes |
|  | 19 | 0.01 | Ditto | Boron | Ditto | Yes |
|  | 20 | 0.01 | Ditto | Phosphorus | Ditto | Yes |
|  | 21 | 0.003 | Ditto | Boron | Ditto | Yes |
|  | 22 | 0.003 | Ditto | Phosphorus | Ditto | Yes |

Comparative Example 1

A plasma etching electrode was produced in the same manner as in Example 2 except that no heat treatment in vacuum was conducted.

Comparative Examples 2–5

Plasma etching electrodes were produced in the same manner as in Example 2 except that single-crystal silicon sheets shown in Table 2 were used.

Comparative Example 6

A plasma etching electrode was produced in the same manner as in Example 2 except that no chemical etching was conducted.

Comparative Example 7

To a single-crystal silicon sheet which was doped with boron, which had an electric resistance of 0.00005 Ωcm and which had crystal faces of (111), were applied boring (788 holes of 0.5 mm in diameter at a hole-to-hole distance of 7 mm) and machining into a disc shape (outer diameter: 280 mm, thickness: 5 mm), using a diamond tool, whereby a plasma etching electrode was produced.

Comparative Example 8

A plasma etching electrode was produced in the same manner as in Example 1 except that there was used a single-crystal silicon sheet which was doped with arsenic, which had an electric resistance of 15 Ωcm and which had crystal faces of (100).

Comparative Example 9

A plasma etching electrode was produced in the same manner as in Example 2 except that a polycrystalline silicon sheet doped with boron and having an electric resistance of 15 ≠cm was used and no chemical etching was conducted.

Comparative Example 10

A plasma etching electrode was produced in the same manner as in Example 2 except that a polycrystalline silicon sheet doped with boron and having an electric resistance of 15 Ωcm was used and no heat treatment in vacuum was conducted.

Comparative Example 11

To a polycrystalline silicon sheet doped with boron and having an electric resistance of 0.00005 Ωcm were applied boring (788 holes of 0.5 mm in diameter at a hole-to-hole distance of 7 mm) and machining into a disc shape (outer diameter: 280 mm, thickness: 5 mm), using a diamond tool, whereby a plasma etching electrode was produced.

TABLE 2

| | | Silicon sheet | | | Treatment for cracks | |
|---|---|---|---|---|---|---|
| | | Electric resistance (Ωcm) | Single crystal or polycrystal /crystal face | Dopant | Chemical etching | In-vacuum heat (400° C.) treatment |
| Comparative Examples | 1 | 15 | Single crystal /(100) | Boron | Mixed acid | No |
| | 2 | 15 | Single crystal /(111) | Ditto | Ditto | Yes |
| | 3 | 15 | Single crystal /(110) | Ditto | Ditto | Yes |
| | 4 | 0.00005 | Single crystal /(100) | Ditto | Ditto | Yes |
| | 5 | 45 | Ditto | Ditto | Ditto | Yes |
| | 6 | 15 | Ditto | Ditto | Not conducted | Yes |
| | 7 | 0.00005 | Single crystal /(111) | Ditto | Not conducted | No |
| | 8 | 15 | Single crystal /(100) | Arserric | Hydrofluoric acid | Yes |
| | 9 | 15 | polycrystal | Boron | Not conducted | Yes |
| | 10 | 15 | Ditto | Ditto | Mixed acid | No |
| | 11 | 15 | Ditto | Ditto | Not conducted | No |

Etching Test

One of the above-produced plasma etching electrodes was set in a plasma etching apparatus; a reactive gas (a mixed gas consisting of trifluoromethane, argon and oxygen) was passed through the apparatus to generate a plasma; thereby, the oxide film of a silicon wafer of 8 in. was etched; and the number of particles of 0.3 μm or more adhering on the wafer surface was counted. The results are shown in Table 3.

TABLE 3

| | | Evaluation of etching | | | | Evaluation of etching | |
|---|---|---|---|---|---|---|---|
| | | Amount of dust adhering onto 10th treated wafer | Amount of dust adhering onto 1000th treated wafer | | | Amount of dust adhering onto 10th treated wafer | Amount of dust adhering onto 1000th treated wafer |
| Example | 1 | 8 | 4 | Comparative Example | 1 | 31 | 52 |
| | 2 | 9 | 11 | | 2 | 26 | 31 |
| | 3 | 10 | 11 | | 3 | 22 | 46 |
| | 4 | 6 | 8 | | 4 | 23 | 32 |
| | 5 | 8 | 9 | | 5 | 40 | 49 |

TABLE 3-continued

| | Evaluation of etching | | | Evaluation of etching | |
|---|---|---|---|---|---|
| | Amount of dust adhering onto 10th treated wafer | Amount of dust adhering onto 1000th treated wafer | | Amount of dust adhering onto 10th treated wafer | Amount of dust adhering onto 1000th treated wafer |
| 6 | 4 | 7 | 6 | 30 | 51 |
| 7 | 5 | 10 | 7 | 34 | 54 |
| 8 | 8 | 4 | 8 | 21 | 49 |
| 9 | 5 | 6 | 9 | 82 | 130 |
| 10 | 8 | 3 | 10 | 66 | 97 |
| 11 | 10 | 6 | 11 | 73 | 144 |
| 12 | 10 | 5 | | | |
| 13 | 10 | 12 | | | |
| 14 | 10 | 12 | | | |
| 15 | 8 | 10 | | | |
| 16 | 8 | 10 | | | |
| 17 | 6 | 8 | | | |
| 18 | 6 | 10 | | | |
| 19 | 9 | 6 | | | |
| 20 | 6 | 5 | | | |
| 21 | 10 | 6 | | | |
| 22 | 10 | 8 | | | |

As shown above, with the plasma etching electrode of the present invention, dust generation can be minimized during etching, and plasma etching can be conducted at a high yield and at a high accuracy.

What is claimed is:

1. A plasma etching electrode made of single-crystal silicon, which has an electric resistance of 0.0001–40 Ωcm, whose crystal faces are (100), which is doped with boron or phosphorus, whose surface has been subjected to an etching treatment with an acid, and which has been subjected to a heat treatment in vacuum.

2. A plasma etching electrode according to claim 1, wherein the amount of doping with boron is $1\times10^{-4}$ to $1\times10^{-3}$ ppm.

3. A plasma etching electrode made of polycrystalline silicon, which has an electric resistance of 0.0001–40 Ωcm, which is doped with boron or phosphorus, whose surface has been subjected to an etching treatment with an acid, and which has been subjected to a heat treatment in vacuum.

4. A plasma etching electrode according to claim 3, wherein the amount of doping with boron is $1\times10^{-4}$ to $1\times10^{-3}$ ppm.

* * * * *